United States Patent
Hissen et al.

(10) Patent No.: US 7,508,266 B1
(45) Date of Patent: Mar. 24, 2009

(54) METHOD FOR ENHANCING LINEARITY OF A TRANSISTOR AMPLIFIER USING SWITCHED CAPACITIVE LOADS

(75) Inventors: Jurgen Hissen, Port Moody (CA); Matthew W. McAdam, Vancouver (CA)

(73) Assignee: PMC-Sierra, Inc., Santa Clara, CA (US)

( * ) Notice: Subject to any disclaimer, the term of this patent is extended or adjusted under 35 U.S.C. 154(b) by 68 days.

(21) Appl. No.: 11/846,959

(22) Filed: Aug. 29, 2007

Related U.S. Application Data

(60) Provisional application No. 60/823,839, filed on Aug. 29, 2006.

(51) Int. Cl.
*H03G 3/10* (2006.01)

(52) U.S. Cl. .................. 330/285; 330/149; 330/278

(58) Field of Classification Search ........... 330/285, 330/149, 278
See application file for complete search history.

(56) References Cited

U.S. PATENT DOCUMENTS

| | | | |
|---|---|---|---|
| 4,335,360 A | 6/1982 | Hoover | |
| 4,622,482 A | 11/1986 | Ganger | |
| 4,680,489 A * | 7/1987 | Stetson | 327/543 |
| 4,752,743 A | 6/1988 | Pham et al. | |
| 4,987,378 A | 1/1991 | Eggleston et al. | |
| 4,992,754 A | 2/1991 | Blauvelt et al. | |
| 5,289,136 A | 2/1994 | De Veirman et al. | |
| 5,420,536 A | 5/1995 | Faulkner et al. | |
| 5,589,797 A | 12/1996 | Gans et al. | |
| 5,808,511 A | 9/1998 | Kobayashi | |
| 6,112,062 A | 8/2000 | Hans et al. | |
| 6,288,669 B1 * | 9/2001 | Gata | 341/172 |
| 6,340,917 B1 | 1/2002 | Villemazet et al. | |
| 6,353,360 B1 | 3/2002 | Hau et al. | |
| 6,794,937 B1 | 9/2004 | Timaru et al. | |
| 6,933,779 B2 * | 8/2005 | Lee et al. | 330/51 |
| 7,257,382 B2 * | 8/2007 | Arai et al. | 455/91 |
| 7,332,964 B2 * | 2/2008 | Zhan et al. | 330/278 |
| 7,400,192 B2 * | 7/2008 | Cho et al. | 330/51 |

OTHER PUBLICATIONS

Gratz, A.; "Operational Transconductance Amplifiers", http://Stromeko.Synth.net/diy/OTA.pdf, Jun. 23, 2006.

* cited by examiner

*Primary Examiner*—Patricia Nguyen
(74) *Attorney, Agent, or Firm*—Anne Kinsman; Borden Ladner Gervais LLP

(57) ABSTRACT

A method and apparatus for linearizing the gain of a common-source field effect transistor (FET) amplifier. The method involves connecting a capacitive load in parallel with the gate of the FET through a switch, and opening and closing this switch depending on the voltage on the gate of the FET. The result is a FET amplifier circuit that has a substantially linear transcapacitance characteristic, making it a useful circuit for low-distortion high-power amplifiers such as xDSL line drivers.

20 Claims, 5 Drawing Sheets

METHOD FOR ENHANCING LINEARITY OF A TRANSISTOR AMPLIFIER USING SWITCHED CAPACITIVE LOADS

CROSS REFERENCE TO RELATED APPLICATIONS

This application claims the benefit of priority of U.S. Provisional Patent Application No. 60/823,839 filed Aug. 29, 2006, which is incorporated herein by reference in its entirety.

FIELD OF THE INVENTION

The present invention relates generally to. More particularly, the present invention relates to.

BACKGROUND OF THE INVENTION

Asymmetric digital subscriber line (ADSL) and very high DSL (VDSL) systems (collectively referred to as XDSL), transmit data simultaneously in both directions on a single pair of wires. To do this successfully, the receiver portion of the interface must be able to separate the desired signals supplied by the far-end transmitter from the other signals being sent by the near-end transmitter. The method used to accomplish this separation is similar to that used in broadcast radio. The frequency spectrum is divided between the two transmitters such that they transmit in separate regions (bands) of the spectrum. A typical VDSL spectrum allocation is shown in FIG. 1. The near-end transmitter bands are designated "US" for upstream, and "DS" for downstream.

Successful transfer of data is complicated by the fact that the line over which the data is transmitted tends to be quite lossy. Hence, the transmitter needs to drive a relatively strong signal, while the receiver is looking for a relatively weak signal from the far-end transmitter. Separating the weak signal from the strong signal generated by the near-end transmitter can be difficult. The transmit path of an xDSL circuit can generally be separated into three stages, as shown in FIG. 2. The first stage is a digital signal processor 10 that generates a mathematically perfect digital representation 12 of the signal. Following this is a digital-to-analog converter (DAC) 14, which converts the signal to weak real-world electrical waveform 16. The final stage is an amplifier 18 (also known as a "line driver"), which amplifies the signal 20 to a level that will be detectable even after transmission over a long lossy line. There are often filtering stages in the path also, which can be considered part of the DAC 14 or line driver 18, and are not shown.

By a process known as intermodulation, any amount of nonlinear distortion in the DAC 14 and line driver 18, which all real circuits have to varying degrees, will damage the spectral purity of the transmitted signal. If this distortion becomes too large, it will pollute the bands of the spectrum reserved for the downstream signal and make it impossible for the receiver to recover the weak signal from the far-end transmitter. Since the line driver amplifier 18 is typically the largest consumer of power in a xDSL analog front end product, it is usually optimized to minimize power consumption. This invariably results in compromised distortion performance; hence the line driver 18 tends to be the limiting source of distortion in the path.

A power amplifier, such as the line driver 18, typically consists of a feed-forward amplifier chain 22 wrapped in negative feedback loop 28 to enhance linearity. This structure is depicted in FIG. 3. Assuming the feedback block 28 is perfectly linear (which is a reasonable approximation), then the distortion of the line driver 18 is a function of two parameters: the intrinsic distortion of the feed-forward amplifier chain 22, and the ability of the negative feedback 28 to suppress any distortion via excess loop gain. The more linear the amplifier chain 22 is, the less excess loop gain is required to suppress that distortion. While excess loop gain tends to translate into higher power, there are also limits to how much excess loop gain can be achieved in any given process technology without making the feedback loop unstable. Also, since it deals with larger signals, the output stage 26 tends to dominate the distortion of the amplifier chain 22. Hence, the more linear the output stage 26 is, the easier the rest of the loop becomes to design.

Power-efficient CMOS output stages typically have poor distortion performance. It is, therefore, desirable to reduce the intrinsic distortion of such an output stage, especially low-order distortion such as the 3rd order harmonic distortion.

SUMMARY OF THE INVENTION

In a first aspect, there is provided a field-effect transistor (FET) amplifier, comprising: at least one amplifying transistor; a switched capacitive load connected in parallel to a terminal of the amplifying transistor; and a comparator to control switching of the capacitive load to the terminal in response to a detected operating point of the amplifying transistor to substantially linearize gain of the amplifying transistor. The amplifying transistor can be, for example, a complementary metal oxide semiconductor (CMOS) transistor, and the amplifier can be a class B or AB amplifier. The amplifier is particularly suited for use in a line driver in an xDSL network.

According to embodiment of this aspect, the FET amplifier can be configured as a common-source amplifier, in which the terminal is the gate of the amplifying transistor, the operating point is determined in accordance with the gate voltage of the amplifying transistor, and the gain is quantified in terms of output signal per unit input charge. The comparator then controls the switching of the capacitive load to the terminal in response to a comparison of the gate voltage to a reference voltage provided by a reference voltage generation circuit, such as a replica biasing circuit. The FET amplifier can also be configured as a common-gate amplifier, in which the terminal is a source of the amplifying transistor; a common-source amplifier, in which the terminal is the drain of the amplifying transistor; and a common-gate amplifier, in which the terminal is the drain of the amplifying transistor.

In a further aspect, there is provided a method of linearizing the gain of a transistor amplifier. The method comprises monitoring an operating point of an amplifying transistor; and actively switching at least one capacitive electrical load in parallel with a terminal of the amplifying transistor in response to the operating point of the amplifying transistor. Monitoring the operating point can comprise monitoring of sensing one or more operating parameters of the amplifying transistor, such as gate voltage and drain voltage.

According to embodiments of this aspect, the amplifier can be configured as a common-source or common-gate amplifier as noted above. The active switching of the capacitive load in parallel with the terminal can, depending on the particular configuration of the amplifier, comprise comparing the gate voltage to at least one threshold voltage, and actively switching the at least one capacitive electrical load in parallel with the terminal when the gate voltage crosses the at least one threshold voltage; comparing the drain voltage to at least one threshold voltage, and actively switching the at least one capacitive electrical load in parallel with the terminal when the drain voltage crosses the at least one threshold voltage; or, comparing the source voltage to at least one threshold voltage, and actively switching the at least one capacitive electrical load in parallel with the terminal when the source voltage crosses the at least one threshold voltage. The threshold voltage can be selected to substantially cancel out undesired harmonic distortion, such as 3rd order and 5th order distortion effects.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Generally, the present invention provides a method and system for improving the gain response of a FET amplifier. In particular, the present invention makes the gain response of a FET amplifier substantially linear (termed herein as "linearizing") by actively switching a capacitive load in parallel to a terminal of an amplifying transistor in response to an operating point of the amplifying transistor. The capacitive load can, for example, be switched on in response the gate or drain voltage of the amplifying transistor crossing a predetermined threshold.

Figure 4:
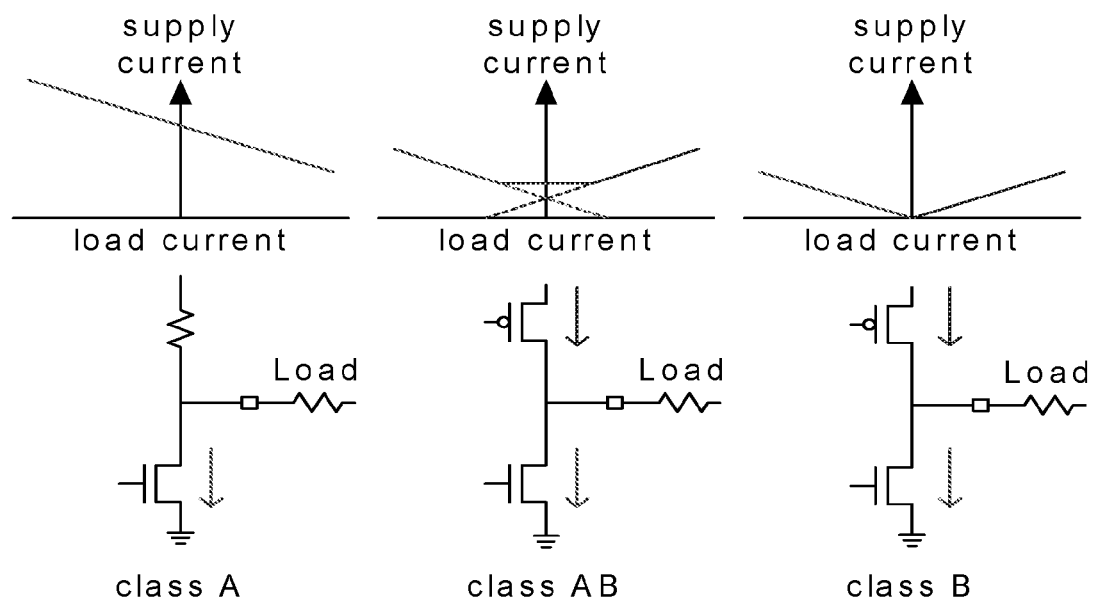
FIG. 4 shows CMOS amplifier classes and supply consumption.

An ideal amplifier output stage is both very linear and very low power. However, there exists a trade-off between these two desired properties that makes these properties largely mutually exclusive. A basic architectural choice is the amplifier class to be used for the output stage. A selection of amplifier classes commonly implemented in complementary metal-oxide semiconductor (CMOS) technology is depicted in FIG. 4.

A class A amplifier is very inefficient because it consumes a substantial amount of supply current even when delivering no current to the load. This current is commonly referred to as "quiescent current". A class B amplifier, on the other hand, consumes only the power that is required by the load, so it is very efficient. The quiescent current can be said to be 0. However, the class B amplifier operates the metal-oxide semiconductor (MOS) transistors close to the point where they are completely turning off. A MOS transistor is highly nonlinear in this region, and this means that class B amplifiers tend to be intrinsically highly nonlinear. By comparison, the class A amplifier operates its single transistor in a region that is far away from the point at which the transistor turns off. So while it is quite power-hungry, a class A amplifier is intrinsically much more linear than a class B amplifier. A compromise architecture (class AB) involves biasing a class B output stage with some extra quiescent current to reduce nonlinearity at the cross-over point. The present invention is particularly suited for use in a class B or AB amplifier.

Figure 1:
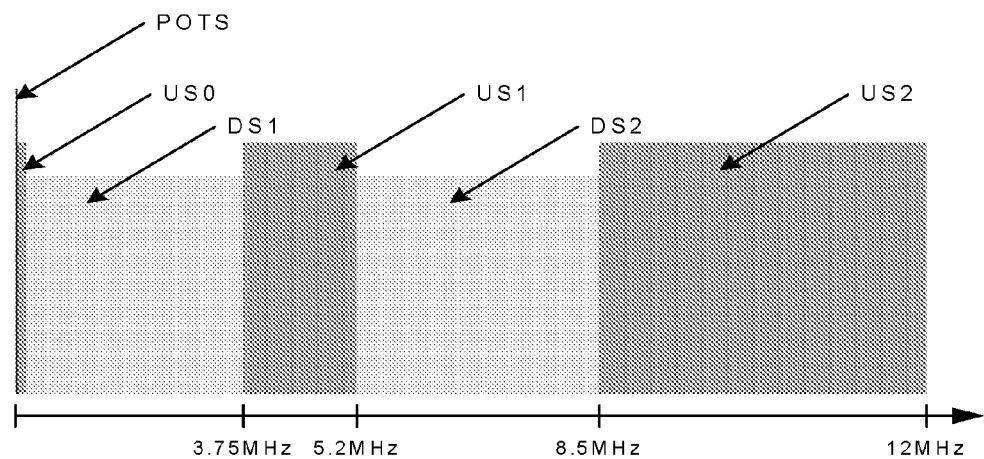
FIG. 1 is a typical xDSL bandplan.
Figure 2:
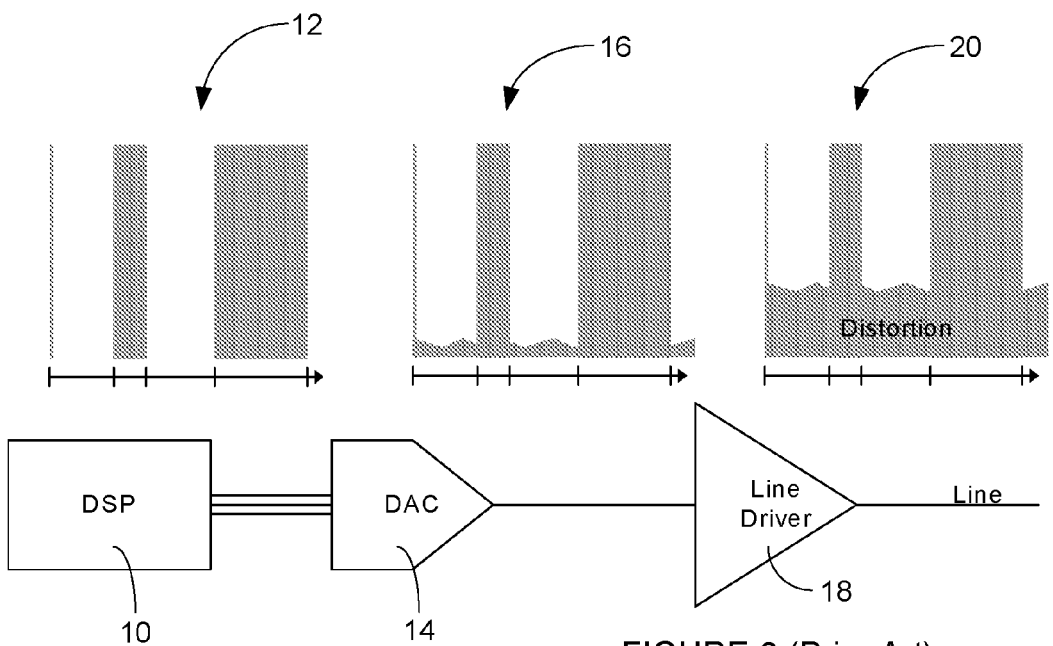
FIG. 2 shows distortion in the transmit path of a DSL network.
Figure 3:
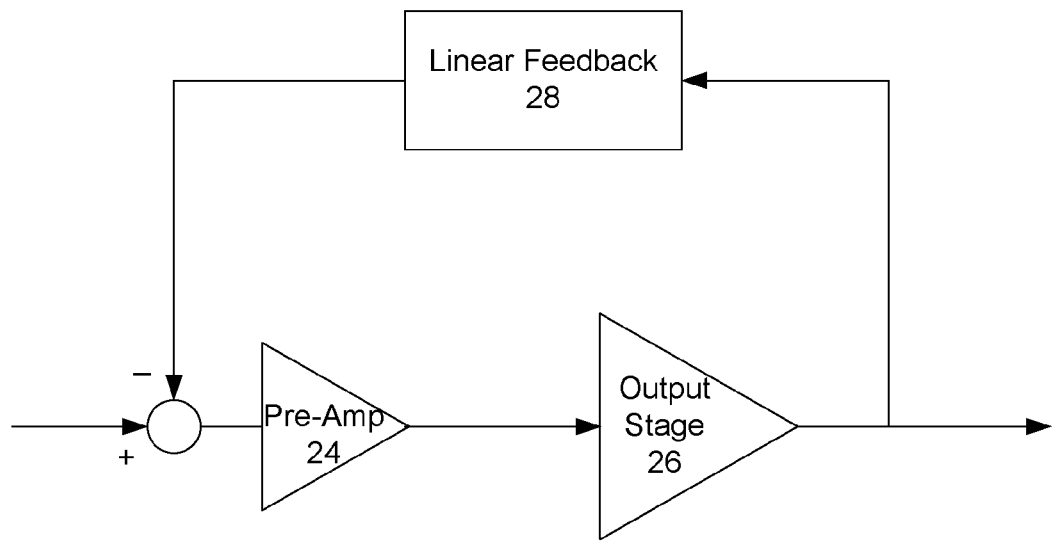
FIG. 3 shows a typical line driver block diagram.

MOS transistors look like current sources at their outputs and like capacitors at their inputs. If the output stage is driving an ideal resistor load, then there are two potentially useful quantities that describe such an output stage: the relationship between input voltage and output voltage, known as "voltage gain"; and the relationship between input gate charge and output voltage, known as "transcapacitance". In the present invention, the quantity to be linearized is the transcapacitance ($V_{OUT}/Q_{IN}$). In an ideal output stage, the voltage gain and transcapacitance would be constant over its entire signal voltage range. However, any real output stage has nonlinearity, which manifests itself as distortion in the signal being transmitted. If we apply the transcapacitance model and drive the output stage with a current source, then it becomes an integrator, which behaves as a dominant pole in the negative feedback loop shown in FIG. 3. The output stage tends to be very large and difficult to drive quickly, so it would be very costly to treat the output stage gate charge as a non-dominant parasitic pole. So, a transcapacitance model aids stability.

Someone skilled in the art will understand that a FET transistor, which forms the heart of an amplifier, can also be accurately described has having a $I_d/Q_g$ (drain current vs. gate charge) relationship. The focus on the $V_d/Q_g$ (drain voltage vs. gate charge) relationship in the present application is merely a matter of convenience, since the term "transcapacitance" can apply to a $V_d/Q_g$ relationship, while there is no similar term for the $I_d/Q_g$ relationship. The present invention substantially linearizes both the $I_d/Q_g$ relationship as well as the $V_d/Q_g$ relationship. Those of skill in the art will also understand that an ideal resistor is mentioned for illustrative purposes only, in order to refer to transcapacitance.

Figure 5:
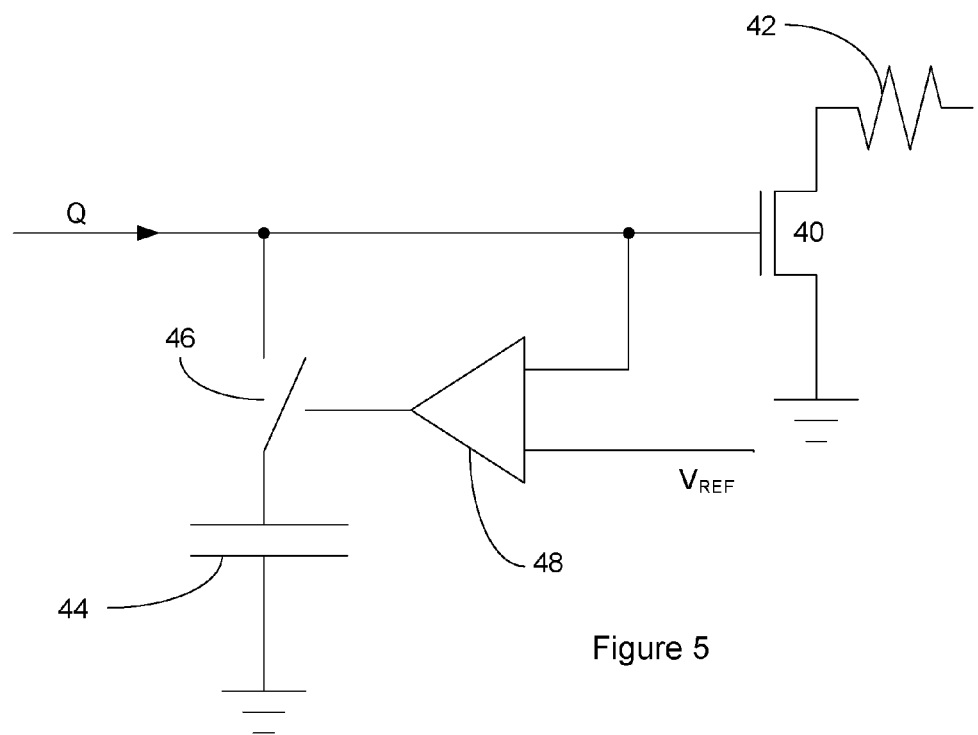
FIG. 5 shows an embodiment of the present invention.

The challenge is to linearize the relationship between input charge and output voltage of a power-efficient CMOS output stage. A power-efficient CMOS output stage 40, as shown in FIG. 5, is inherently nonlinear because of the nonlinear $I_d/Q_g$ (drain current vs. gate charge) relationship of a MOS device, particularly when operating near the threshold voltage of the MOS device (i.e. where it turns off). When the output stage is loaded with an ideal resistor load 42, the drain current ($I_d$) becomes a voltage $V_{OUT}$ and so the nonlinear relationship ($V_d/Q_g$) can be quantified as a transcapacitance. The transcapacitance can be linearized by modifying the input charge required for a given output voltage.

The linearity of the amplifier, or output stage 40, is enhanced by intermittently connecting an additional capacitive load 44 to the gate of the output stage MOS transistors by a switch 46, as shown in FIG. 5. When this capacitive load 44 is connected to the gate, any change in MOS gate voltage will require more charge than before. A comparator 48 is used to control the opening and closing of the switch 46. This way, the capacitive load 44 is added to the gate (making it "heavier") whenever the gate voltage $V_g$ is above a certain threshold. And it is disconnected (making the gate "lighter") whenever the gate voltage $V_g$ is below that threshold. By using conventional replica biasing, the reference level $V_{REF}$ can be generated in a process-variation insensitive way, so that the switching occurs in the region of the MOS transistor's behaviour where the intrinsic drain current vs. gate-charge relationship increases.

In the presently preferred embodiment, the input gate voltage $V_g$ is used to determine the operating point of the amplifying transistor. However, depending on the configuration of the amplifier, one could also use the drain or source voltage to determine the current operating point of the amplifier. One could get an even more detailed measure of operating point by also looking at multiple characteristics of the transistor, such as its drain voltage $V_d$ in combination with its gate voltage $V_g$. It is commonly understood that the gain of a FET-based common-source transistor amplifier drops when the drain-to-source voltage of the amplifying transistor decreases. Measuring the drain voltage $V_d$ is therefore also useful for the purposes of linearization.

Figure 6:
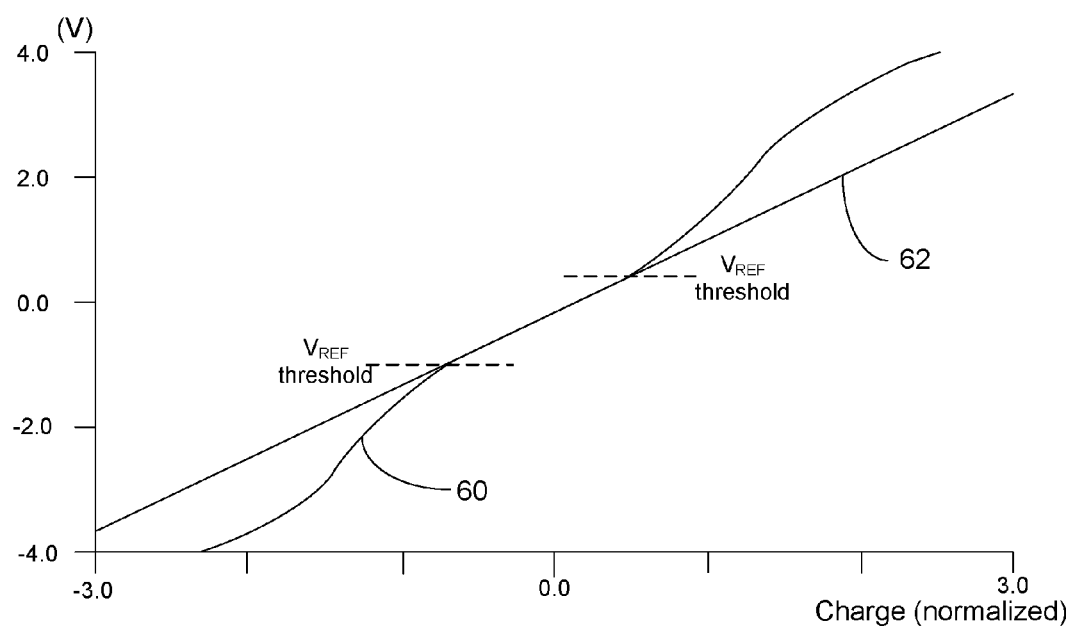
FIG. 6 shows transcapacitance curves of a simulated differential amplifier.

A simulation result of the circuit behaviour can be seen in FIG. 6. In this figure, two curves are shown. Curve 60 depicts the intrinsic nonlinearity of a differential class AB MOS amplifier; while curve 62 depicts the much more linear behaviour of an amplifier incorporating the present invention. The driving MOS device for both simulations is identical, the only difference being the addition of the capacitor and switch, which are the subject of this invention. As can be seen, the invention is capable of making the circuit response (according to the transcapacitance metric) significantly linear without increasing the quiescent current of the output devices.

Ideally, the comparator 48 behaves such that the switch 46 is closed precisely when the voltage across the switch is 0V (that is, precisely when the gate voltage $V_g$ of the driving device 40 crosses the reference level $V_{REF}$). Depending on the design of the comparator 48, there can be a slight latency between when the signal reaches the reference voltage $V_{REF}$ and when the switch 46 is turned on or off. This latency results in a slight voltage difference across the switch when it is closed and this causes a sudden in-rush of current. The in-rush of current causes a step change in the gate voltage of the driving device, which can create high-order harmonic distortion of the signal. To reduce the effects of charge-injection into the input being switched, dummy switches driven by opposite polarity signals can be added.

The comparator 48 can also be designed to minimize charge-injection effects. A comparator is typically used to compare two voltages (such as when the gate voltage $V_g$ of the MOS transistor crosses a threshold). The comparator 48 can be designed and biased internally such that its output voltage is precisely at the threshold voltage of the MOS switch when the comparator's inputs are at 0V differential. The comparator 48 can also employ techniques that reduce its sensitivity to slew rate of the input, such as capacitive phase leading which shifts the threshold of the comparator proportionally to the slew rate of the input signal.

In addition, high-order harmonic distortion tends not to be as harmful as lower-order harmonic distortion because the intermodulation products of high-order distortion tend to be spread out over a wider range of frequencies. This means that less high-order distortion falls into the bands reserved for the far-end transmitter's signal, so contamination of that weak signal is less than would be expected. It is therefore beneficial to select threshold voltages and load sizes to deliberately cancel particular types of distortion (eg. lower-order harmonics) even if this worsens higher-order harmonic distortion.

Someone skilled in the art will recognize that this technique can be generalized to other types of amplifier configurations. For example, a common-gate amplifier could benefit from this type of approach to reduce distortion. Someone skilled in the art can also see how this technique can be extended by using multiple capacitive loads switched in at multiple thresholds in a piece-wise linear configuration. This could be used to more precisely cancel the nonlinearity of the amplifying transistor, thereby further reducing the overall distortion of the amplifier.

In other embodiments, multiple amplifying transistors can be used. Often, the amplifying transistors are more complex than single transistors. They may be cascoded for reliability reasons, including overstress and ESD (electro-static discharge) threats, as is well-known in the art. They may be physically implemented in modified ways to achieve ESD robustness (such as ballast resistances or increased spacing geometries). None of these modifications affect their basic operation, as is well understood in the art.

The reference level $V_{REF}$ can be selected to combat the differences between the PMOS and NMOS driving transistors in a CMOS process. This would be chiefly applicable to differential drivers, where there is also an interest in controlling common-mode noise. The reference levels can also be programmable, to compensate for device drift or variation over process and temperature.

The linearization can be enhanced further by using multiple switches and multiple comparators (in a piece-wise linear configuration) for each amplifying transistor to more accurately cancel other nonlinearities in the transistor gain.

Figure 7:
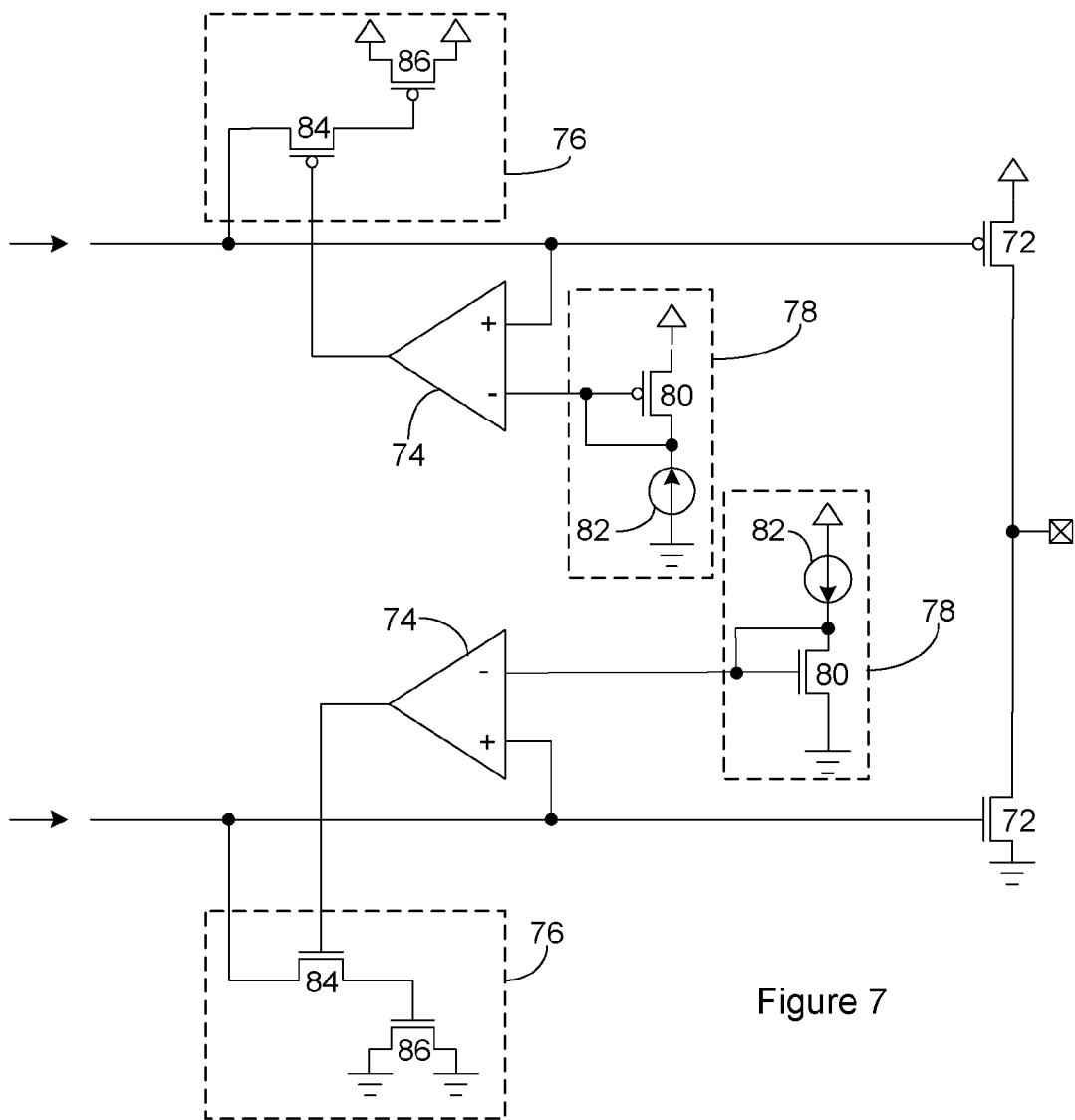
FIG. 7 shows an embodiment of a differential amplifier according to the invention.

FIG. 7 shows transistor-level embodiment of the invention as a single-ended class AB output stage 70. The amplifying transistors 72 are each connected to a comparator 74 and a switched capacitive load 76. The comparators 74 are also connected to reference voltage generation circuits 78. The comparators 74 can be implemented in a number of different ways, as is well-known in the art. The $V_{REF}$ generation circuits 78 use conventional replicas 80 of the driving devices (i.e. amplifying transistors 72) biased with a current source 82. Replica biasing is a standard approach which avoids sensitivities to process and temperature variation of MOS parameters such as threshold voltage. The switched capacitive loads 76 are provided by the transistors 84 and 86, which are switched on by the comparator in response to the gate voltage of the amplifying transistors crossing a threshold determined by $V_{REF}$. As will be appreciated, the switched capacitive loads 76 can be implemented in other ways than using the MOS devices depicted.

Figure 8:
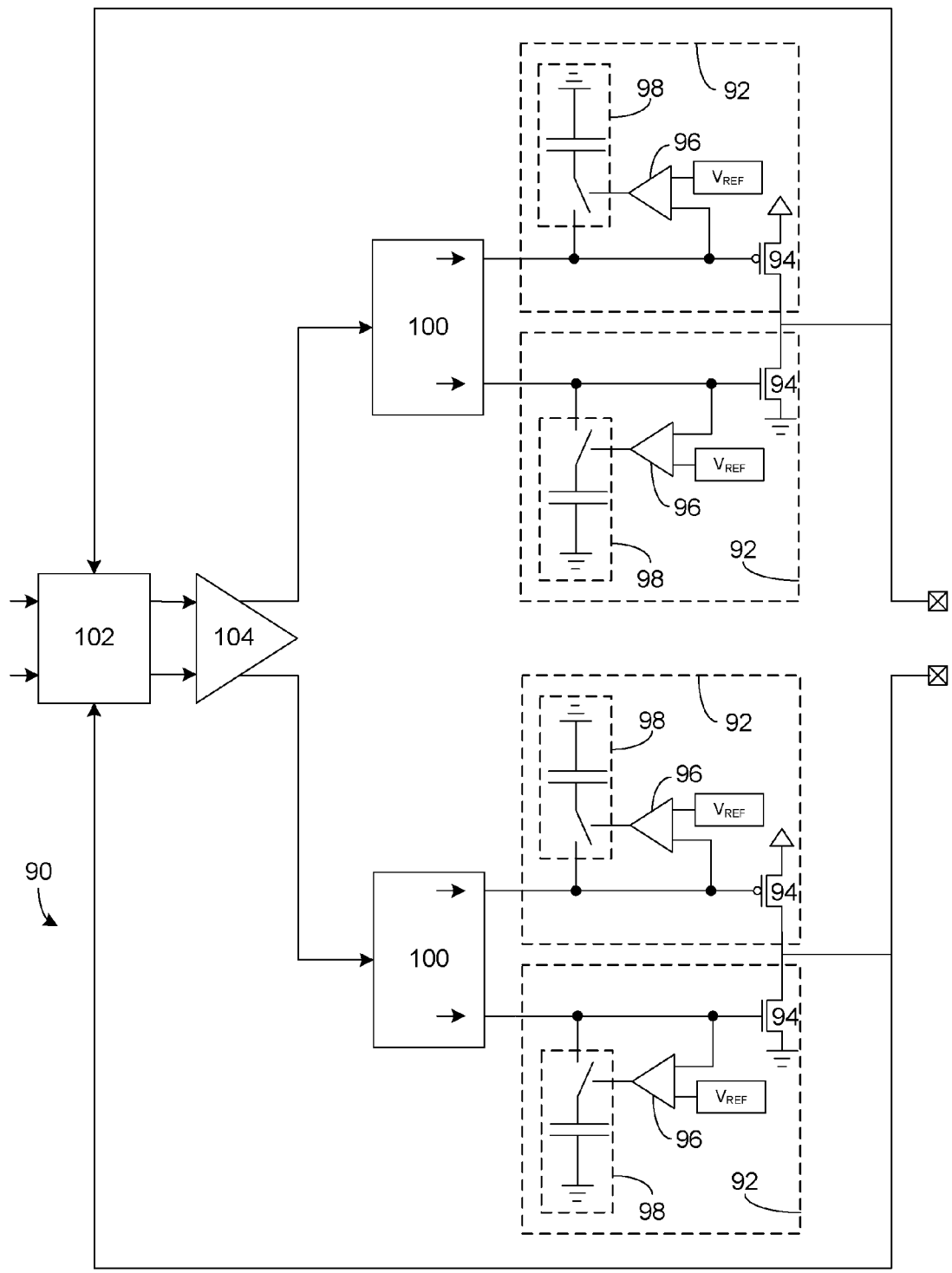
FIG. 8 shows an xDSL line driver employing the invention.

FIG. 8 shows a complete differential xDSL line driver 90 employing the invention to achieve improved distortion performance. Although for the sake of simplicity, FIG. 5 shows a single-ended amplifier architecture, typical xDSL line drivers, as is well-known to those of skill in the art, are differential. Differential architectures are inherently free of even-order harmonic distortion and are more resistant to external noise sources (such as power supply noise). Because the real signal paths are differential, the harmonics of interest are the odd harmonics (3rd, 5th, and 7th order, etc.). The even harmonics are assumed to be insignificant. The differential line driver 90 includes two amplifier sections 92, each of which can be implemented as shown in FIG. 7. As in FIG. 7, the amplifier sections 92 each consist of amplifying transistors 94 connected to a comparator 96 and a switched capacitive load 98. The inputs of the amplifying sections 92 are connected to biasing networks 100, while their outputs are connected to a feedback network 102. A conventional pre-amplifier stage 104 can also be included as shown.

Generally, the present invention is most applicable to any high-power distortion-sensitive amplifier operating on relatively low frequency signals (compared to the maximum frequency of the FET technology). The actual frequency of the signals will depend on the response time of the comparator, since the comparator must be able to keep up with the signal it is amplifying. The term "amplifier" also encompasses "line driver". It is applicable to both single-ended and differential amplifiers, and is applicable whether the amplifier is used in an open-loop or a closed-loop configuration.

As will be appreciated, the present invention particularly improves the linearity of a class AB or B output stage for any given amount of quiescent bias current. Since there are trade-offs between different characteristics of a line driver, this property can be used to achieve improved distortion performance for a fixed power consumption, and/or to achieve reduced power consumption for a fixed distortion performance. Since power consumption and distortion performance are both critical parameters for an integrated line driver, the benefits are significant. Decreased power consumption can lead to cost reduction of chip packaging and/or of heat dissipation methods employed in the chip design. Improved distortion performance can also yield higher data transmission rates on the line being driven by the line driver.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention. For example, specific details are not provided as to whether the embodiments of the invention described herein are implemented as a software routine, hardware circuit, firmware, or a combination thereof.

The above-described embodiments of the invention are intended to be examples only. Alterations, modifications and variations can be effected to the particular embodiments by those of skill in the art without departing from the scope of the invention, which is defined solely by the claims appended hereto.

What is claimed is:

1. A field-effect transistor (FET) amplifier, comprising:
   at least one amplifying transistor;
   a switched capacitive load connected in parallel to a terminal of the amplifying transistor; and
   a comparator to control switching of the capacitive load to the terminal in response to a detected operating point of the amplifying transistor to substantially linearize gain of the amplifying transistor.

2. The FET amplifier of claim 1 wherein: the FET amplifier is configured as a common-source amplifier, the terminal is the gate of the amplifying transistor, the operating point is determined in accordance with the gate voltage of the amplifying transistor, and the gain is quantified in terms of output signal per unit input charge.

3. The FET amplifier of claim 2 wherein the comparator controls the switching of the capacitive load to the terminal in response to a comparison of the gate voltage to a reference voltage provided by a reference voltage generation circuit.

4. The FET amplifier of claim 3 wherein the reference voltage generation circuit is a replica biasing circuit.

5. The FET amplifier of claim 1 wherein the FET amplifier is configured as a common-gate amplifier, and the terminal is a source of the amplifying transistor.

6. The FET amplifier of claim 1 wherein the FET amplifier is configured as a common-source amplifier, and the terminal is the drain of the amplifying transistor.

7. The FET amplifier of claim 1 wherein the FET amplifier is configured as a common-gate amplifier, and the terminal is the drain of the amplifying transistor.

8. The FET amplifier of claim 1 wherein the at least one amplifying transistor is a complementary metal oxide semiconductor (CMOS) transistor.

9. The FET amplifier of claim 8 wherein the FET amplifier is a class B amplifier.

10. The FET amplifier of claim 8 wherein the FET amplifier is a class AB amplifier.

11. A line driver for an xDSL network comprising a plurality of FET amplifiers according to claim 8.

12. A method of linearizing the gain of a transistor amplifier, comprising:
    monitoring an operating point of an amplifying transistor;
    actively switching at least one capacitive electrical load in parallel with a terminal of the amplifying transistor in response to the operating point of the amplifying transistor.

13. The method of claim 12 wherein the amplifying transistor is a FET, the amplifier is configured as a common-source amplifier, the terminal is the gate of the amplifying transistor, the operating point is a gate voltage of the amplifying transistor, and wherein actively switching the at least one capacitive load in parallel with the terminal comprises:
    comparing the gate voltage to at least one threshold voltage, and
    actively switching the at least one capacitive electrical load in parallel with the terminal when the gate voltage crosses the at least one threshold voltage.

14. The method of claim 13 wherein the at least one threshold voltage is selected to substantially cancel 3rd order distortion effects.

15. The method of claim 13 wherein the at least one threshold voltage is selected to substantially cancel 5th order distortion effects.

16. The method of claim 12 wherein the amplifying transistor is a FET, the amplifier is configured as a common-source amplifier, the terminal is the drain of the amplifying transistor, the operating point is a drain voltage of the amplifying transistor, and wherein actively switching the at least one capacitive load in parallel with the terminal comprises:
    comparing the drain voltage to at least one threshold voltage, and
    actively switching the at least one capacitive electrical load in parallel with the terminal when the drain voltage crosses the at least one threshold voltage.

17. The method of claim 12 wherein the amplifying transistor is a FET, the amplifier is configured as a common-gate amplifier, the terminal is the source of the amplifying transistor, the operating point is a source voltage of the amplifying transistor, and wherein actively switching the at least one capacitive load in parallel with the terminal comprises:
    comparing the source voltage to at least one threshold voltage, and
    actively switching the at least one capacitive electrical load in parallel with the terminal when the source voltage crosses the at least one threshold voltage.

18. The method of claim 12 wherein the amplifying transistor is a FET, the amplifier is configured as a common-gate amplifier, the terminal is the drain of the amplifying transistor, the operating point is a drain voltage of the amplifying transistor, and wherein actively switching the at least one capacitive load in parallel with the terminal comprises:
    comparing the drain voltage to at least one threshold voltage, and
    actively switching the at least one capacitive electrical load in parallel with the terminal when the drain voltage crosses the at least one threshold voltage.

19. The method of claim 12 wherein monitoring the operating point comprises sensing a plurality of operating parameters.

20. The method of claim 19 wherein the plurality of parameters include gate voltage and drain voltage.

* * * * *